United States Patent
Koike et al.

(10) Patent No.: US 6,787,478 B2
(45) Date of Patent: Sep. 7, 2004

(54) METHOD OF FORMING DEPOSITED FILM

(75) Inventors: Atsushi Koike, Kanagawa (JP); Masahiro Kanai, Tokyo (JP); Hirohito Yamaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 64 days.

(21) Appl. No.: 10/400,872

(22) Filed: Mar. 28, 2003

(65) Prior Publication Data

US 2003/0190412 A1 Oct. 9, 2003

(30) Foreign Application Priority Data

Apr. 5, 2002 (JP) ........................................ 2002-103879

(51) Int. Cl.[7] .............................................. H01L 21/31
(52) U.S. Cl. .............................. 438/758; 438/1; 438/5; 438/717
(58) Field of Search ............................... 438/1, 5, 717, 438/758

(56) References Cited

U.S. PATENT DOCUMENTS

| | | | | |
|---|---|---|---|---|
| 4,908,330 A | * | 3/1990 | Arai et al. ...................... 438/5 |
| 5,126,169 A | | 6/1992 | Ishihara et al. ........... 427/255.1 |
| 5,374,318 A | * | 12/1994 | Rabalais et al. ............. 428/469 |
| 5,445,710 A | * | 8/1995 | Hori et al. ................... 438/717 |
| 6,239,453 B1 | * | 5/2001 | Yamada et al. ................ 257/79 |
| 6,470,823 B2 | | 10/2002 | Yajima et al. ............... 118/723 |
| 6,526,910 B2 | | 3/2003 | Yajima et al. ............... 118/723 |
| 6,554,972 B1 | * | 4/2003 | Ichihara et al. ......... 204/192.26 |
| 2001/0000335 A1 | * | 4/2001 | Yamada et al. ................. 438/1 |
| 2002/0009546 A1 | | 1/2002 | Koike et al. ............ 427/255.27 |
| 2002/0090815 A1 | | 7/2002 | Koike et al. ................. 438/680 |
| 2003/0003243 A1 | * | 1/2003 | Ueno .......................... 427/569 |
| 2003/0143868 A1 | | 7/2003 | Yamaguchi et al. ......... 438/788 |

FOREIGN PATENT DOCUMENTS

| | | |
|---|---|---|
| JP | 5-117847 | 5/1993 |
| JP | 6-151421 | 5/1994 |

* cited by examiner

*Primary Examiner*—John F. Niebling
*Assistant Examiner*—Olivia T. Luk
(74) *Attorney, Agent, or Firm*—Fitzpatrick, Cella, Harper & Scinto

(57) ABSTRACT

In a deposited-film-forming method of forming a compound film on a substrate by a chemical reaction between the particles of a raw material emitted from a raw material particle generation source opposed to the substrate in the direction of the substrate, and the atoms of a reactive gas supplied to a flying space of the particles of the raw material, the space being interposed between the substrate and the raw material particle source, the atoms of a rare gas in an excited state are supplied to the flying space of the particles of the raw material, in order to ionize the atoms of the reactive gas and the particles of the raw material and thereby induce the chemical reaction.

8 Claims, 10 Drawing Sheets

METHOD OF FORMING DEPOSITED FILM

BACKGROUND OF THE INVENTION

1. Field of the Invention

The present invention relates to a method of forming a deposited film, and more specifically to a method of forming a deposited film by reactive ionization, which is employed in the production of various semiconductor devices, and which comprises ionizing a reactive gas and thereby increasing the reactivity of it with particles of a raw material to deposit a film of a desired composition on a substrate.

2. Related Background Art

In already known reactive ion film forming methods, as represented by reactive sputtering and reactive evaporation, a reactive gas is supplied into a flying space of particles of a raw material, namely a space provided in a vacuum chamber and interposed between a source for generating particles of a raw material for a deposited film and a substrate, thereby causing a chemical reaction between the particles of the raw material and the reactive gas and forming a compound film on the substrate.

However, in case the chemical reaction between the raw material particles and the reactive gas is insufficient, the compound film obtained by the aforementioned known methods does not necessarily contain a component element of the reactive gas in a necessary amount, so that a desired film property often cannot be obtained.

In order to solve this problem and to sufficiently induce a chemical reaction between the raw material particles and the reactive gas, Japanese Patent Applications Laid-open Nos. 5-117847 and 6-151421 disclose a method of supplying a rare gas such as helium or neon together with a sputtering gas and a reactive gas into the flying space of the raw material particles.

The aforementioned patent applications disclose that with the supply of helium gas, helium atoms are excited in a plasma on the surface of a target, then the excitation energy of the helium atom is transferred to the reactive gas to ionize atoms of the reactive gas, and the ionized atoms of the reactive gas combine with the raw material particles by a high reactivity of the ionized atoms to form a compound film of a high quality.

However, the method disclosed in the aforementioned patent applications have a following problem. In case of a mere introduction of helium, neon or a mixture thereof into the flying space of the raw material particles, when argon constituting the sputtering gas has a high content in the rare gas, the electron temperature in the plasma on the target surface becomes equal to or less than an ionizing potential of argon (15.8 eV), whereby excited helium (about 19.8 eV or higher) or excited neon (about 16.6 eV or higher) having a higher excitation energy than that of argon ion cannot be sufficiently generated, so that the ionization of the reactive gas by the rare gas atoms in the excited state cannot take place in sufficient manner.

Also, when the content of argon is lowered to increase the content of helium, neon or a mixture thereof, the electron temperature is elevated close to the ionizing potential of helium or neon and also the number of excited species thereof increases to elevate the ionization rate of the reactive gas, but, in such case, the film formation rate is significantly lowered because of a decrease in the content of argon having a sputtering rate of 1 to 2 times of that of neon and 3 to 15 times of that of helium.

Consequently, a method of merely introducing helium, neon or a mixture thereof into the flying space of the raw material particles is unable to induce sufficient ionization of the reactive gas and is limited in the compatibility of improvement in the stoichiometry of the formed film and film formation rate.

SUMMARY OF THE INVENTION

An object of the present invention is to solve the problems in the aforementioned conventional technologies, and to provide a method of forming a deposited film by ionizing atoms of a reactive gas and particles of a raw material, increasing the reactivity of both at a surface of a substrate and reducing an aberration of a formed film from a stoichiometric composition, thereby forming a compound film of a high quality at a high film formation rate.

More specifically, a method of forming a deposited film on a substrate according to the present invention comprises:

a step of emitting particles of a raw material from a raw material particle generation source opposed to the substrate in a direction of the substrate;

a step of supplying atoms of a reactive gas in a flying space of the particles of the raw material, the space being interposed between the substrate and the raw material particle generation source;

a step of supplying atoms of a rare gas in an excited state to the flying space of the particles of the raw material to ionize the atoms of the reactive gas and the particles of the raw material; and a step of forming a compound film on the substrate by a chemical reaction of the ionized atoms of the reactive gas and the ionized particles of the raw material.

DETAILED DESCRIPTION OF THE PREFERRED EMBODIMENTS

Figure 1:
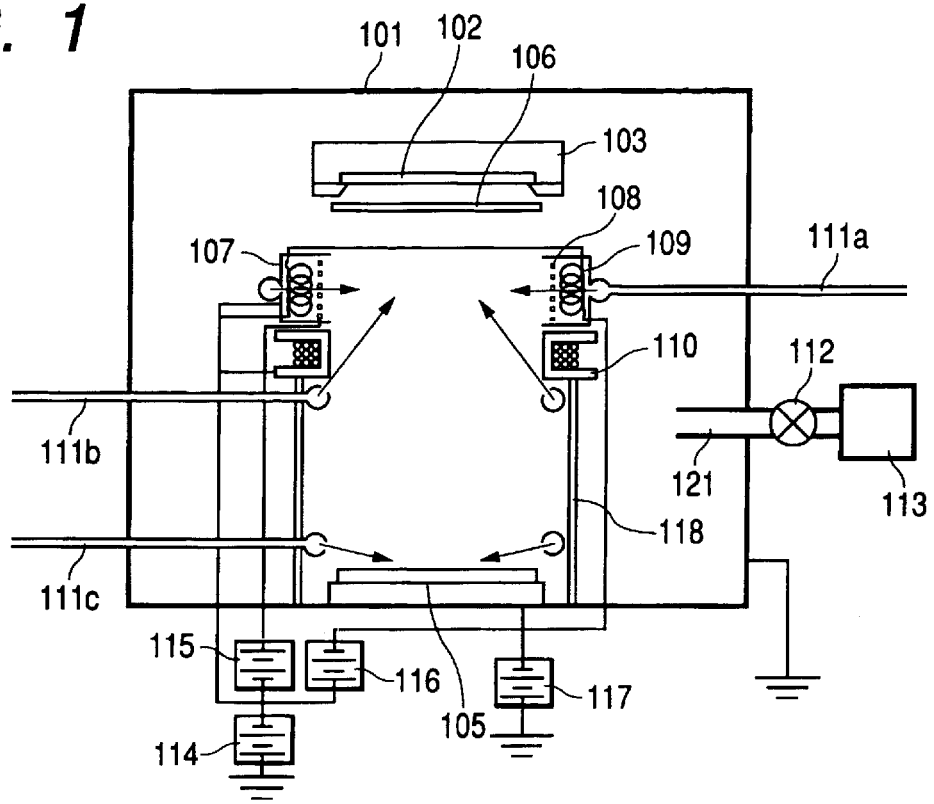
FIG. 1 is a schematic view showing a configuration of a deposited-film-forming apparatus capable of executing a method for forming a deposited film according to the present invention.

In the present invention, when a chemical reaction generates between particles of a raw material and atoms of a reactive gas to form a compound film on a substrate on which a film is to be formed, atoms of a rare gas in an excited state are introduced into a flying space of the raw material particles, whereby the reactive gas atoms and the raw material particles are ionized by collision with the rare gas atoms in the excited state to elevate the ionization rate of the reactive gas atoms and the raw material particles and thereby accelerate the chemical reaction.

It is already disclosed, for example in Japanese Patent Application Laid-open No. 5-117847, to generate particles of a raw material from a raw material particle generation source employing a process gas including a rare gas in addition to a reactive gas, thereby forming a compound film from the raw material particles and the reactive gas atoms, on a substrate. The aforementioned patent application describes that an introduction of helium as a rare gas into a flying space of the raw material particles when a compound film is formed by a reactive sputtering method improves the composition of the formed film.

In a method of forming a compound film without the above-mentioned introduction of a rare gas, an increase in the amount of supply of the reactive gas, for bringing the composition of the compound film closer to the stoichiometric ratio, realizes an improvement of the composition, though very slowly, within a range of a small supply amount. However, when the supply amount is increased further, a reaction rate increases between a target material and the reactive gas on the surface of the target and the rate of a product generation on the target surface eventually exceeds an etching rate by sputtering of argon ions, thereby causing a product deposition on the target surface. In general, in the reactive sputtering, the sputtering rate of a product after reaction is smaller than that prior to reaction, and thereby the starting of the product deposition on the target surface generates a decrease in the film formation rate of the compound film and a change in film composition with elapse of the time. Besides, the amount of use of the reactive gas becomes enormously large and certain metal materials do not react sufficiently with the reactive gas in this method, so that the aforementioned method cannot be an effective means for production.

With respect to such problem, the helium introductions disclosed in the aforementioned patent application allows to excite He in the plasma on the target surface and to cause ionization or decomposition excitation of the reactive gas of a lower excitation energy through an energy transition process by the internal energy of the helium in the excited state, whereby thus resulting ions of the reactive gas atoms can combine, by a high reactivity thereof, with the raw material particles to form a compound film of a high quality.

However, in case of merely introducing helium into the sputtering gas and the reactive gas, the effect does not appear unless the proportion of helium present in the flying space of the raw material particles is made sufficiently high, and, when the proportion of helium is elevated to about 70% where the improvement in the composition starts to appear, the film formation rate is lowered significantly because the sputtering rate of helium is smaller than in argon as explained in the foregoing, whereby the process loses practicality as production means.

In order to solve such problem, the present invention supplies rare gas atoms in an excited state to the flying space of the raw material particles, whereby the atoms of the reactive gas and the particles of the raw material are ionized by collisions with the rare gas atoms in the excited state and have a higher ionization rate to accelerate the chemical reaction. As a result, even in case the proportion of the rare gas having an excited state capable of ionizing the reactive gas atoms is about 40% or less in the entire process gas, the reactive gas atoms and the raw material particles are ionized in the flying space of the raw material particles to accelerate a reaction of the both on the substrate surface whereby a compound film of a high quality and an excellent uniformity can be formed with a high film formation rate.

Also in the present invention, since there are supplied rare gas atoms in a quasi-stable excitation state having a longer lifetime of the excited state, the reactive gas atoms and the raw material particles attain an even higher ionization rate to further accelerate the chemical reaction.

Also in the present invention, the rare gas atoms in an excited state by optically permitted transition are supplied to the flying space of the raw material particles to achieve ionization of the reactive gas atoms and the raw material particles by collisions with the rare gas atoms in such optically permitted transition excited state.

The aforementioned "ionization by the rare gas in excited state" has been considered, based on the length of the excitation lifetime, to be caused by the rare gas atoms in the quasi-stable excited state. However, the present inventors have found that the ionization takes place even after the lifetime of the quasi-stable excited state is exhausted and that the species contributing to the ionization are not only the quasi-stable excited state but also an excited state by optically permitted transition which has the same energy and the same or higher generation (transition) probability. The present invention has been achieved on such finding.

Also in the present invention, the rare gas atoms have an internal energy capable of ionizing the reactive gas atoms, thereby causing an effective ionization of the reactive gas atoms and the raw material particles in the flying space of the raw material particles.

Also in the present invention, by forming a divergent magnetic field directed toward a substrate on which a film is to be formed in the flying space of the raw material particles, the raw material particles and the reactive gas atoms in the ionized state can smoothly move to the substrate by a bipolar diffusion based on such divergent magnetic field even in a high-pressure atmosphere in which partial pressures are elevated in order to increase the frequency of collision of the rare gas atoms in the excited state with the raw material particles or with the reactive gas atoms (namely in order to further elevate the ionization rate). As a result, it is possible to form a compound film of a high quality and an excellent uniformity in quality, without a negative dependence of a film formation rate on the pressure as observed in conventional sputtering and evaporation.

Also in the present invention, an electron flow is supplied to the flying space of the raw material particles in the presence of a divergent magnetic field toward the substrate to significantly increase the generation number of the rare gas atoms in the excited state, thereby elevating the ionization rate of the reactive gas atoms and the raw material particles. Also the electron flow supplied in the direction of the magnetic field further increases the bipolar diffusion rate in comparison with the case without the supply of the electron flow, thereby enabling formation of a compound film of a high quality and an excellent uniformity in the quality with a high film formation rate.

Furthermore, in the present invention, in order to supply helium or neon which has a larger internal energy in the excited state among the rare gases, the reactive gas atoms and the raw material particles are more efficiently ionized in the flying space of the raw material particles. This effect accelerates the chemical reaction of the reactive gas atoms and the raw material particles on the surface of the substrate, thereby enabling formation of a compound film of a high quality and an excellent uniformity in the quality with a high film formation rate.

In the embodiments of the present invention, a compound film of a high quality, extremely close to a stoichiometric composition can be formed at a high film formation rate by the application of the aforementioned means. This is based on following two points relating to the film quality and the film formation rate, discovered by the intensive investigations of the present inventors.

(1) In the flying space of the raw material particles, presence of a rare gas containing at least either of atoms in an optically permitted transition excited state in a high concentration and atoms in a quasi-stable excited state in a high concentration provides an eminent effect on the improvement of the composition of the compound film.

(2) In the presence of an ionized gas and ionized raw material particles, presence of a divergent magnetic field directed toward the substrate on which a film is to be formed provides an eminent effect for increasing the film formation rate.

At first, there will be given an explanation on an example of a deposited-film-forming apparatus to be employed in executing the method for forming deposited film according to the present invention. However, the method for forming a deposited film according to the present invention can be exercised in various deposited-film-forming apparatuses and is not limited to the execution in the apparatus to be explained in the following.

FIG. 1 is a schematic cross-sectional view of a deposited-film-forming apparatus, capable of executing the method for forming a deposited film according to the present invention.

The deposited-film-forming apparatus shown in FIG. 1 is provided with a vacuum chamber 101 for executing film formation on a substrate 102 constituting a substrate on which a film is to be formed, gas introduction pipes 111a–111c for introducing process gases such as a sputtering gas, a reactive gas etc. into the vacuum chamber 101, a sputtering target 105 of a metal material for forming raw material particles, a deposition preventing member 118 of a cylindrical shape surrounding the sputtering target 105, an electromagnet 110 provided on and along the deposition preventing member 118, a thermal electron emitting unit 107 provided on the electromagnet 110, a substrate holder 103 for supporting the substrate 102, provided opposite to the sputtering target 105, a shutter 106 positioned between the substrate 102 supported by the substrate holder 103 and the sputtering target 105, and vacuum-exhaust means 113 for evacuating the interior of the vacuum chamber 101 through an exhaust pipe 121.

The substrate holder 103 is maintained in an electrically floating state from the grounded vacuum chamber 101, so that the substrate 102 supported by the substrate holder 103 is also set in a floating potential. The sputtering target 105 opposed to the substrate 102 is connected to a DC target power source 117.

The electromagnet 110 is so positioned as to surround a flying space of raw material particles, and generates a divergent magnetic field having a direction from the sputtering target 105 toward the substrate 102 and such a distribution that the magnetic fluxes are spread toward the substrate 102.

The thermal electron emitting unit 107, for neutral excitation of the rare gas atoms, is provided with a filament 109 constituting a hot cathode and a grid 108 constituting an anode, and emits thermal electrons toward the center of the flying space of the raw material particles.

The electromagnet 110 and the thermal electron emitting unit 107 are set at the same potential, which is controlled at a predetermined voltage, with respect to the ground potential, by a floating voltage setting DC power source 114. Potentials of the grid 108 and the filament 109 provided in the thermal electron emitting unit 107 are controlled at predetermined voltages by a grid voltage setting DC power source 115 and a filament voltage setting DC power source 116 with reference to the floating voltage of the thermal electron emitting unit 107, respectively.

The shutter 106 is opened when discharges in the vicinity of the sputtering target 105 and in the electron emitting unit 107 are stabilized, thereby forming a film having an arbitrary thickness on the surface of the substrate 102.

The end portions of the gas introduction pipes 111a–111c provided in the vacuum chamber 101 are formed as circle-shaped pipes along the cylindrical shape of the deposition preventing member 118 and has a plurality of gas emission holes for emitting gas toward the center of the flying space of the raw material particles.

A reference character 111a indicates a rare gas introduction pipe for introducing a rare gas, which is other than the sputtering gas, into the thermal electron emitting unit 107. Introduction of the rare gas from the rare gas introduction pipe 111a into the thermal electron emitting unit 107 causes the rare gas atoms to collide with the electrons emitted from the filament 109, thereby shifting the rare gas atoms to an excited state. Also by filling the interior of the thermal electron emitting unit 107 with the rare gas and forming a flow of the rare gas from the thermal electron emitting unit 107 toward the flying of the raw material particles, it is possible to prevent diffusion and entry of the reactive gas into the thermal electron emitting unit 107 and to avoid a reaction with the reactive gas which is a cause of deterioration of the filament 109.

A reference character 111b indicates a reactive gas introduction pipe for introducing a reactive gas into the flying space of the raw material particles. The gas emitting holes provided in the aforementioned circle-shaped pipe of the reactive gas introduction pipe 111b are directed toward the substrate 102, in order to reduce as far as possible the flow of the reactive gas into the vicinity of the sputtering target 105, thereby minimizing the reaction of the reactive gas with the surface of the sputtering target.

A reference character 111c indicates a sputtering gas introduction pipe for introducing argon gas, which constitutes a sputtering gas, into the flying space of the raw material particles. The gas emitting holes provided in the aforementioned circle-shaped pipe of the sputtering gas introduction pipe 111c are directed toward the sputtering target 105, in order to form a pressure slope from the surface of the sputtering target toward the substrate 102 to thereby prevent diffusion of the reactive gas toward the sputtering target 105 and minimize the reaction of the reactive gas with the surface of the sputtering target.

A flow path for the process gases introduced from the aforementioned gas introduction pipes is formed by the deposition preventing member 118, the electromagnet 110 and the thermal electron emitting unit 107. Therefore, the process gases flow in the flying space of the raw material particles from the sputtering target 105 toward the substrate 102, then flow out of the flying space of the raw material particles through a gap between the thermal electron emitting unit 107 and the substrate holder 103 and are thereafter discharged from the vacuum chamber 101.

The exhaust pipe 121 is provided with an exhaust valve 112, of which aperture is regulated to maintain the process gases in the vacuum chamber 101 at a constant pressure.

The rare gas introduced from the rare gas introduction pipe 111a has a function that the atoms of the rare gas itself become an excited state and then collide with the reactive gas atoms or the raw material particles thereby causing a Penning ionization of such atoms or particles.

For ionizing the reactive gas atoms or the raw material particles having a high ionization potential, the rare gas atoms should have an excitation energy as high as possible, and there is required supply of electrons of a higher energy in order to generate the rare gas atoms of such excited state.

Also, since atoms of a smaller atomic weight have a smaller ionization cross section and show a smaller collision rate with other atoms, there is required a larger amount of electron supply for generating a given number of excited atoms in a rare gas of a smaller atomic weight and a larger excitation energy than in a rare gas of a larger atomic weight and a smaller excitation energy.

As the representative examples of the reactive gas, $N_2$, $O_2$, $F_2$, $Cl_2$, $Br_2$ or $I_2$, or a compound formed by a combination of the constituent elements of these molecules may be used. A compound which is not gaseous at the normal temperature can be used by gasification by a suitable method.

The raw material of the sputtering target 105 is generally Al, Mg, Zr, La, Nd, Ce, Pb, Er, Sb, Fe, Ti, Cd, Zn, W, Bi, Ca, Li, Na etc. or an alloy thereof or a compound containing one or more of these metals.

A thin film that can be formed is a compound film such as of aluminum fluoride, magnesium fluoride, zirconium fluoride, lanthanum fluoride neodymium fluoride, cerium fluoride, lead fluoride, erbium fluoride, calcium fluoride, lithium fluoride, sodium fluoride, antimony sulfide, cadmium sulfide, zinc sulfide, iron oxide, titanium oxide, cerium oxide, cadmium oxide, antimony oxide, tungsten oxide, silicon oxide, bismuth oxide, aluminum oxide, calcium oxide, lead chloride etc., or a compound film containing two or more of these.

The substrate 102 on which the film is to be formed can be a light-transmissive substrate or an opaque substrate, and materials for the substrate include semiconductor materials such as silicon and GaAs; insulating materials and optical materials such as glass, quartz and fluorite; and metal materials such as stainless steel and aluminum.

In the following there will be given an explanation on the action of the aforementioned rare gas on the ionization of the reactive gas atoms and the raw material particles.

The reactive gas atoms and the raw material particles directly cause Penning dissociation by collisions with the rare gas atoms in the excited state, or the reactive gas in a molecular state generates reactive gas atoms by a collision dissociation and thereafter the ionization also takes place by a Penning dissociation. The reactive gas atoms and the raw material particles in the ionized state show an action radius increased by a charge in contributing to the reaction, in comparison with a state prior to the dissociation, thereby significantly increasing the reactivity on the substrate.

Now, consideration will be given as to how to increase the frequency of collision of the rare gas atoms in the excited state with the reactive gas atoms and the raw material particles, for the purpose of ionization of the reactive gas atoms and the raw material particles.

In order to increase the frequency of collisions of the rare gas atoms in the neutral excited state with the reactive gas atoms and the frequency of collisions of the rare gas atoms in the excited state with the raw material particles, it is considered necessary not only "to increase the proportion of the neutral excited species in the rare gas" but also "to increase the partial pressure of the rare gas" for a following reason.

In the conventional technologies, the rare gas is employed to increase the lifetime of such neutral excited species in order to "increase the proportion of the neutral excited species in the rare gas". In the conventional sputtering which is a representative example of an atom ionizing process, the neutral excited species of argon are generated in a large amount in the presence of a strong magnetic field on the target surface and electrons of a high energy, and sputtering particles of a low ionization potential are ionized by collisions with the neutral excited species of argon. However, in such conventional sputtering, the collisions between the argon atoms in the excited state and the sputtering particles, in the plasma generated in the vicinity of the target, are not realized with a sufficiently high frequency. This situation is identifiable from measurements by various researchers, indicating that the ionization rate in the sputtering particles is about 1 to 5% at maximum.

It is therefore understood necessary, in order to increase the reactivity by ionization of the reactive gas atoms and the raw material particles, not only to elevate the proportion of the neutral excited species in the rare gas but also to "elevate the partial pressure of the rare gas" in order to achieve a significant increase in the amount thereof. Therefore, in the aforementioned conventional sputtering, the conventional technology of merely adding a rare gas such as helium or neon into the flying space of the raw material particles therefore generates a situation which is difficult to generate the neutral excited species, because of following two aspects that (1) the generation energy of such neutral excited species is larger than that of argon and (2) the reacting cross section for the generation by electron impact is also smaller than that of argon, so that the effectiveness in generating the atoms in the neutral excited state is quite limited.

Based on the results of the aforementioned investigations, in the present invention, an increase in the partial pressure of the rare gas in the flying space of the raw material particles and a supply of an electron flow of a controlled energy by the thermal electron emitting unit makes it possible to realize a high concentration of the rare gas atoms in the neutral excited state and significantly improve the probability of the Penning dissociation and the collision dissociation, whereby the reactive gas atoms and the raw material particles can mostly be ionized.

In the following there will be explained an effect, in the apparatus of the aforementioned configuration, of a divergent magnetic field generated in the flying space of the raw material particles by the electromagnet 110.

In general, a higher pressure in the flying space of the raw material particles reduces an average free stroke thereof, thereby inducing random scattering of the raw material particles and resulting in a significant decrease in the deposition rate. In the present invention, however, the decrease in the deposition rate is solved by inducing a smooth bipolar diffusion of ions of three kinds toward the substrate 102 by (1) ionization of the raw material particles and the reactive gas, (2) ionization of a rare gas having an atomic weight larger than that of neon (such rare gas having an ionization potential of 15.8 eV or less and being easily ionized by helium or neon in a neutral excited state) and showing an evident effect of scattering the raw material particles by collision therewith, and (3) formation of a divergent magnetic field toward the substrate on which a film is to be formed. The optimized bipolar diffusion allows to obtain a deposition rate equal to or larger than in the aforementioned conventional sputtering even in a pressure range of several hundred times of that in the conventional sputtering.

The aforementioned effect of the divergent magnetic field will be explained in more detail in the following.

The divergent magnetic field is formed with such a distribution that the magnetic field intensity becomes weaker in the flying space of the raw material particles from an ionizing portion toward the substrate 102. Electrons supplied into the flying space having such divergent magnetic field execute a spiral movement by a Lorentz's force along (around) the magnetic fluxes which spread toward the substrate, thereby extending the staying time in the flying space and increasing the electron density, in comparison with a case without the magnetic field. The increase in the electron density increases the generation amount of the rare gas in the neutral excited state, and the increased rare gas in the neutral excited state collides with the raw material particles, the reactive gas and the rare gas, thereby increasing the ion number of them. By increasing the ionization rates of the raw material particles, the reactive gas and the rare gas having an atomic weight larger than neon and showing an eminent effect of scattering the raw material particles, such gas ions inducing scattering start to move toward the substrate by the bipolar diffusion, with the same speed as that of the raw material particle ions, whereby the scattering effect decreases rapidly. Owing to such effect, the deposition rate is not lowered even under a high pressure condition.

In the following there will be explained an effect, in the apparatus of the aforementioned configuration, of an electron flow supplied from the thermal electron emitting unit 107.

As explained in the foregoing, the thermal electron emitting unit 107 causes thermal electrons to collide with the atoms of the rare gas, thereby bringing the rare gas atoms into a neutral excited state. The rare gas atoms may also be activated by emitting a high frequency excitation energy into the flying space of the raw material particles thereby generating a plasma, but the thermal electron emitting unit 107 can freely control the energy of the electrons supplied to the flying space of the raw material particles regardless of the pressure therein, and is capable of generating the neutral excited species required a high activation energy even under a high pressure condition.

Also a hot cathode process in which, as in the thermal electron emitting unit 107, the thermal electrons emitted from the filament 109 are accelerated to an arbitrary energy by the grid 108 positioned close to the filament 109, enables an extremely precise energy control thereby selectively generating the neutral excited species according to the necessity.

In the following there will be explained examples of the method for forming a deposited film according to the present invention, but the present invention is by no means limited to such examples.

EXAMPLE 1

In Example 1, a film was formed by reactive sputtering in the deposited-film-forming apparatus of the configuration shown in FIG. 1, under a supply of helium, argon and oxygen gases. As a source for generating the raw material particles, there was employed a sputtering target 105 of silicon of a diameter of 4 inches. Silicon atoms directed from the sputtering target 105 to the substrate 102 collided with excited helium atoms generated in the electron emitting unit 107 thereby being ionized by Penning dissociation. The ions of silicon, argon and oxygen were subjected to the bipolar diffusion by the divergent magnetic field which was formed by the electromagnet 110 and directed toward the substrate 102, and reached the substrate 102, thereby forming a silicon oxide film on the surface of the substrate.

In the following, the method for forming a deposited film according to the present invention will be explained in detail in the following steps (1) to (6).

(1) In the apparatus shown in FIG. 1, a silicon wafer of a diameter of 4 inches as the substrate 102, was set in the substrate holder 103 of stainless steel (floating potential), and the interior of the vacuum chamber 101 was evacuated by the vacuum-exhaust means 113 to a pressure of $10^{-4}$ Pa or lower.

(2) Then, under continued evacuation, helium at 450 sccm was introduced from the rare gas introduction pipe 111a, oxygen at 15 sccm was introduced from the reactive gas introduction pipe 111b and argon at 1035 sccm was introduced from the sputtering gas introduction pipe 111c, and the aperture of the exhaust valve 112 was so adjusted as to maintain the internal pressure of the vacuum chamber 101 at 4.0 Pa.

(3) A current was supplied to the copper wire of the electromagnet 110, and the current value thereof was so set that the magnetic field at the center of the electromagnet 110 becomes 150 G.

(4) The floating voltage setting DC power source 114 was so set that the thermal electron emitting unit 107 has a potential of −40 V with respect to the ground potential, then the grid voltage setting DC power source 115 was set at 20 V, and the filament voltage setting DC power source 116 was adjusted in this state to obtain a grid current of 15 A, thereby initiating the emission of thermal electrons from the filament 109.

(5) In the state of the aforementioned step (4), an electric power of 500 W was applied from the target DC power source 117 to the silicon sputtering target 105 positioned at a distance of 150 mm below the substrate 102, thereby initiating a sputtering. The shutter 106 was opened after the sputtering rate was stabilized, thereby initiating film formation on the substrate 102. In the course of the film forming process, a light emission between the electron emitting unit 107 and the substrate holder 103 was taken, through a view port (not shown) provided in the vacuum chamber 101, by an optical fiber into a plasma spectrophotometer and a luminous intensity of a spectral line of helium at a wavelength of 728 nm was measured.

(6) The shutter 106 was closed when the thickness of the film deposited on the substrate 102 reached 200 nm, and the substrate 102 was taken out from the apparatus and was set on a secondary ion mass spectrometer (SIMS) for measuring an O/Si ratio of the formed film. As a result of measurement, it was confirmed that the formed film had an approximately stoichiometric composition. Also a compound film of a high quality could be obtained even in case the proportion of the rare gas in the entire process gases was about 40% or less.

In the following there will be explained results of measurement of the formed film when the grid voltage was varied.

The film formation was executed by changing the set voltage of the grid voltage setting DC power source 115 as 10 V, 15 V, 20 V and 25 V while maintaining other conditions unchanged, and luminous intensity and O/Si ratio of the sample were measured for each condition.

Figure 2:
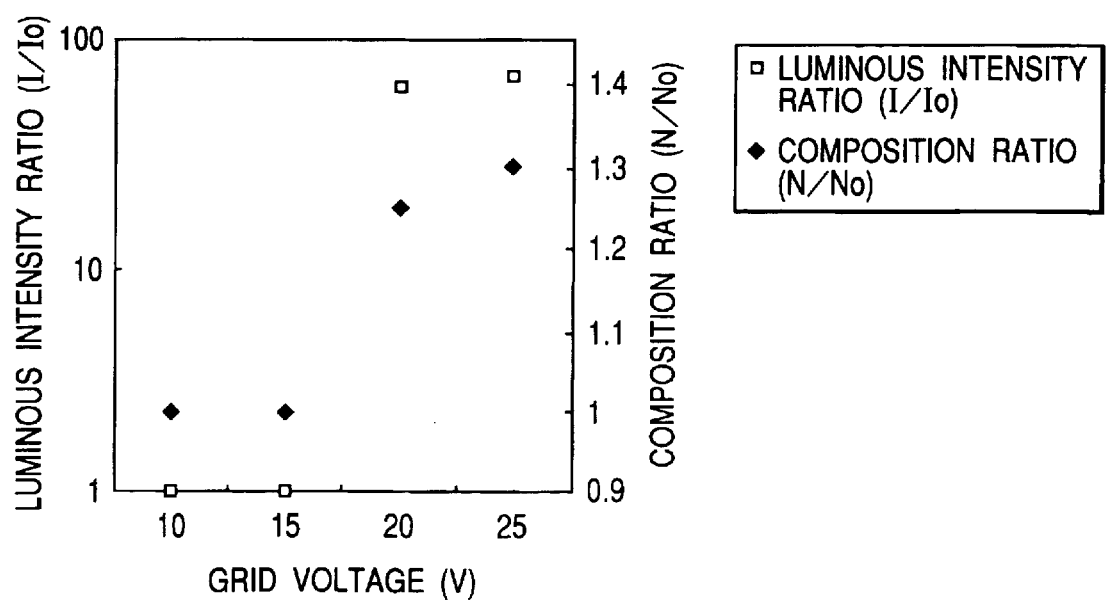
FIG. 2 is a graph, according to Example 1 of the present invention, showing the dependence of a luminous intensity ratio (I/Io) which indicates a level of generation of an excited state by an optically permitted transition, and a relative composition ratio (N/No) which indicates a level of introduction of a reactive gas into a deposited film, on a grid voltage.

FIG. 2 is a graph showing the dependence of the luminous intensity and the O/Si ratio on the grid voltage. The measured value of the luminous intensity is represented by a ratio (luminous intensity ratio I/Io) defining as criterion the luminous intensity (Io) measured in a case without the electron emission as 1, and the measured value of the O/Si ratio is represented by a ratio (relative composition ratio N/No) defining as criterion the O/Si ratio (No) measured in a case where the helium is not supplied and the argon supply is increased correspondingly to 1485 sccm.

From FIG. 2, it is observable that the amount of oxygen in the formed film increases along with an increase in the amount of generation of the helium atoms in the optically permitted transition excited state, formed by absorption of the electromagnetic wave. This fact will be explained in detail, in the dependence of the O/Si ratio on the total process gas supply amount to be explained in the following.

In the following there will be explained results of measurement of the film formed when the total supply amount of the process gases was varied.

The total supply amount of three gases was changed in various manners, while maintaining the oxygen supply amount at 15 sccm, and also maintaining the supply amount ratio of helium and argon constant (450:1035), and the aforementioned process steps (5) and (6) were executed for each condition of the total supply amount of the gases (measurement of luminous intensity not being executed).

Figure 3:
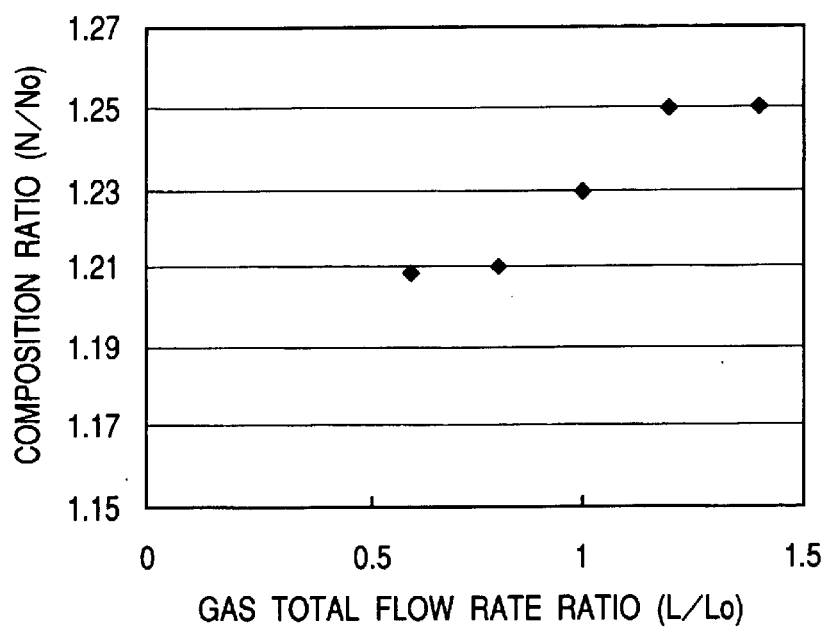
FIG. 3 is a graph, according to Example 1 of the present invention, showing the dependence of a relative composition ratio (N/No), which indicates a level of introduction of a reactive gas into a deposited film, on a total gas flow rate ratio.

FIG. 3 is a graph showing the dependence of O/Si ratio on the total supply amount of process gases, wherein the total supply amount of process gases is represented by a ratio (total gas flow rate ratio L/Lo) defining as criterion a total supply amount (Lo), which causes a significant change in the O/Si ratio of the formed film, and showing the dependence of the relative composition ratio (N/No) on the total gas supply amount ratio (L/Lo) with two points on each of front and rear sides.

FIG. 3 indicates that a part of the oxygen amount increased by the effect of helium addition decreases at a certain total gas supply amount. For a given helium atom, a decrease in the total supply amount increases the staying time of this atom in the space between the target and the substrate (flying space of raw material particles), and the above-mentioned fact is considered to indicate that an oxygen ionizing ability is decreased or lost by the extension of the staying time. This means that the lifetime of the quasi-stable excited state of helium has exhausted and it is considered that the continued ionization of oxygen thereafter is realized by the aforementioned optically permitted transition excited state of helium atoms.

In the following there will be explained results of measurement of the film formed when the intensity of the magnetic field by the electromagnet 110 is changed.

The magnetic field intensity at the center of the electromagnet 110 was changed to 0 G, 30 G, 60 G, 90 G and 120 G, and the aforementioned steps (5) and (6) were executed for each condition of the magnetic field intensity (measurement of luminous intensity not being executed).

Figure 4:
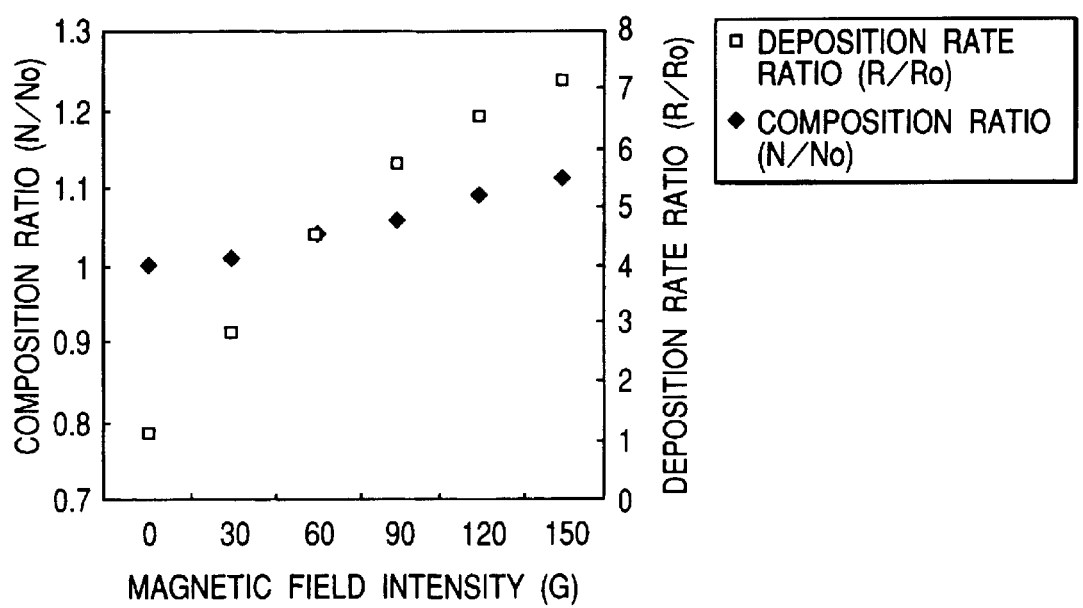
FIG. 4 is a graph, according to Example 1 of the present invention, showing the dependence of a deposition rate ratio (R/Ro), and a relative composition ratio (N/No) which indicates a level of introduction of a reactive gas into a deposited film, on a magnetic field intensity.

FIG. 4 is a graph showing the dependence of the O/Si ratio and the deposition rate on the magnetic field intensity, and shows a ratio (deposition rate ratio R/Ro) defining as criterion a deposition rate (Ro) in the absence of the magnetic field and a relative composition ratio (N/No) on the magnetic field intensity.

From FIG. 4, it is observable that the change in the composition ratio is very slow while the change in the deposition rate ratio is very large, indicating a large dependence of the deposition rate on the magnetic field intensity.

EXAMPLE 2

Figure 5:
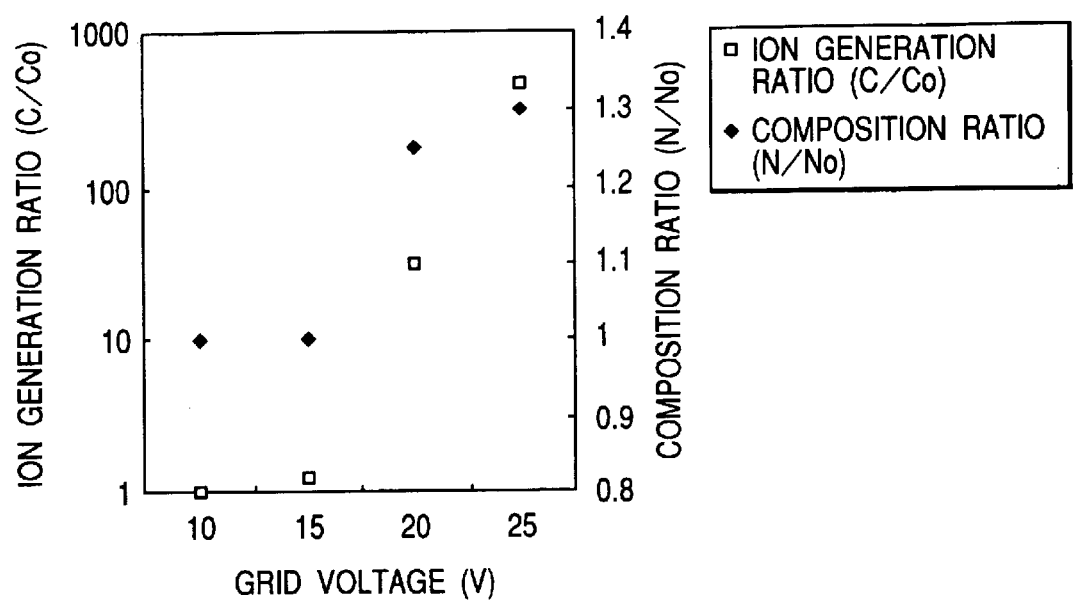
FIG. 5 is a graph, according to Example 2 of the present invention, showing the dependence of an ion generation ratio (C/Co) which indicates a level of ionization of the reactive gas, and a relative composition ratio (N/No) which indicates a level of introduction of reactive gas into a deposited film, on a grid voltage.

Example 2 employs the deposited-film-forming apparatus of the configuration shown in FIG. 1, but is different from Example 1 in that the substrate holder 103 was replaced by a quadrapole mass spectrometer. All other conditions were the same as in Example 1. An $O^+$ amount was measured by the mass spectrometer without operating the ionizing unit, and was represented by a ratio (ion generation ratio C/Co) defining as criterion the $O^+$ amount (Co)in a state where the helium was not supplied and the argon supply was correspondingly increased to 1485 sccm. FIG. 5 is a graph showing the dependence of the ion generation ratio (C/Co) and the relative composition ratio (N/No) measured in Example 1 on the grid voltage.

In the following there will be explained results of measurement of the ion generation ratio when the grid voltage was varied while employing neon instead of helium.

The film formation and $O^+$ measurement by the mass spectrometer were executed by changing the set voltage of the grid voltage setting DC power source 115 to 7 V, 12 V, 17 V and 22 V, to determine the ion generation ratio (C/Co), and the composition ratio (O/Si) was measured for each sample in film formation.

Figure 6:
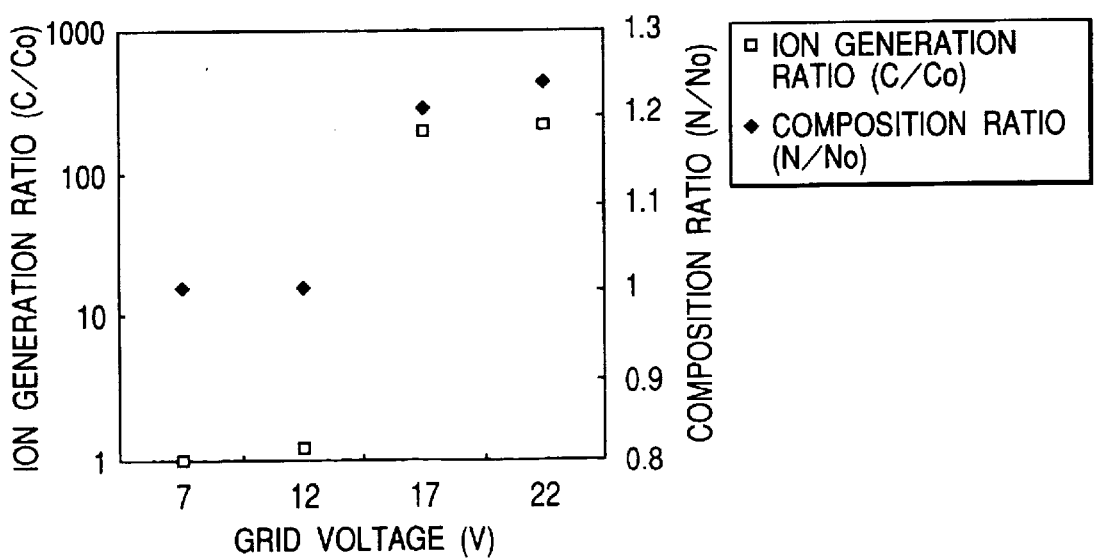
FIG. 6 is a graph, in case of employing another rare gas according to Example 2 of the present invention, showing the dependence of an ion generation ratio (C/Co) which indicates a level of ionization of the reactive gas, and a relative composition ratio (N/No) which indicates a level of introduction of reactive gas into a deposited film, on a grid voltage.

FIG. 6 is a graph showing the dependence of the ion generation ratio and the O/Si ratio on the grid voltage, wherein the O/Si ratio is represented by a ratio (relative composition ratio N/No) defining as criterion the O/Si ratio measured in a case where the helium is not supplied and the argon supply is increased correspondingly to 1485 sccm, and indicating the dependence of these ratios on the grid voltage.

From FIG. 6, it is observable that the film had a substantially stoichiometric composition when the grid voltage was 17 V or higher.

In the following there will be explained a comparative example employing argon instead of helium in Example 2, in order to confirm the effect of Example 2.

This comparative example is different from Example 2 in employing argon instead of helium. After the change in the rare gas, the film formation and $O^+$ measurement by the mass spectrometer were executed by changing the set voltage of the grid voltage setting DC power source 115 to 2 V, 7 V, 12 V, 17 V and to determine the ion generation ratio (O/Si). Also the composition ratio (C/Co) was measured for each sample in film formation.

Figure 7:
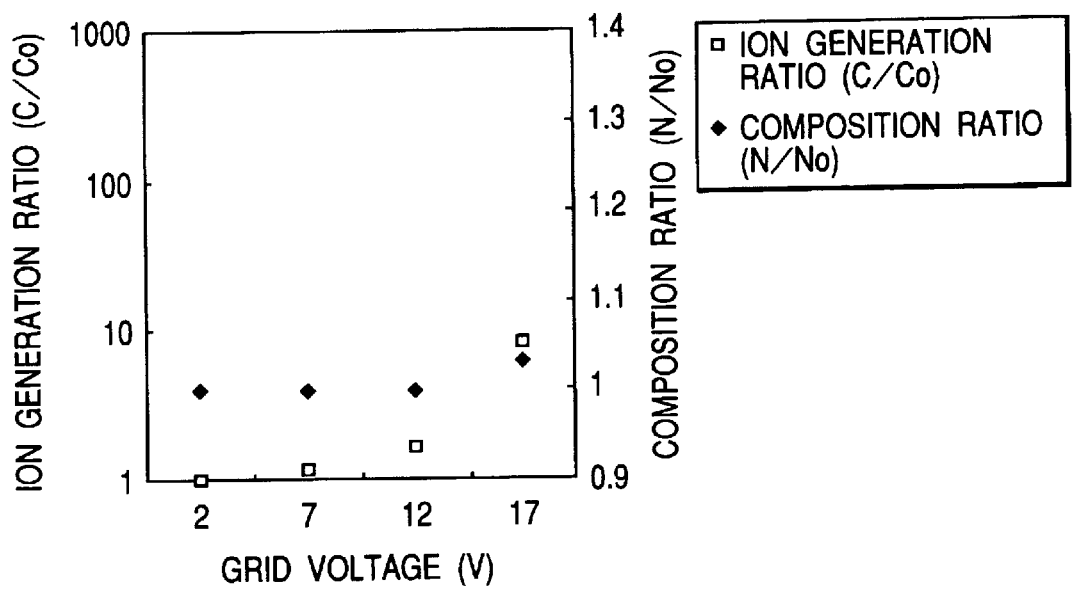
FIG. 7 is a graph, according to a comparative example of the present invention, showing the dependence of an ion generation ratio (C/Co) which indicates a level of ionization of a reactive gas, and a relative composition ratio (N/No) which indicates a level of introduction of the reactive gas into a deposited film, on a grid voltage.

FIG. 7 is a graph showing the dependency of the ion generation ratio and the O/Si ratio on the grid voltage, wherein the O/Si ratio is represented by a ratio (relative composition ratio N/No) defining as criterion the O/Si ratio measured in a case where the helium is not supplied and the argon supply is increased correspondingly to 1485 sccm as 1, and indicating the dependence of these ratios on the grid voltage.

From FIGS. 5, 6 and 7, it is understood that, in the method for forming a deposited film according to the present invention, since the rare gas in the excited state has an internal energy capable of ionizing the reactive gas, it is possible to form a film of a high quality close to the stoichiometric composition with a high film deposition rate.

Also helium and neon, having a large internal energy in the excited state among the rare gases, can induce efficient ionization of the reactive gas atoms and the raw material particles in the flying space of the raw material particles.

EXAMPLE 3

Example 3 is different from Example 1 in employing neon instead of helium. After the change in the rare gas, film formation was executed by changing the set voltage of the grid voltage setting DC power source 115 to 7 V, 12 V, 17 V and 22 V, to measure a O/Si ratio, and the relative composition ratio (N/No) was measured. Also the spectral light emission of the plasma was measured at a spectrum line of neon of a wavelength 585 nm, and the luminous intensity ratio (I/Io) was determined.

Figure 8:
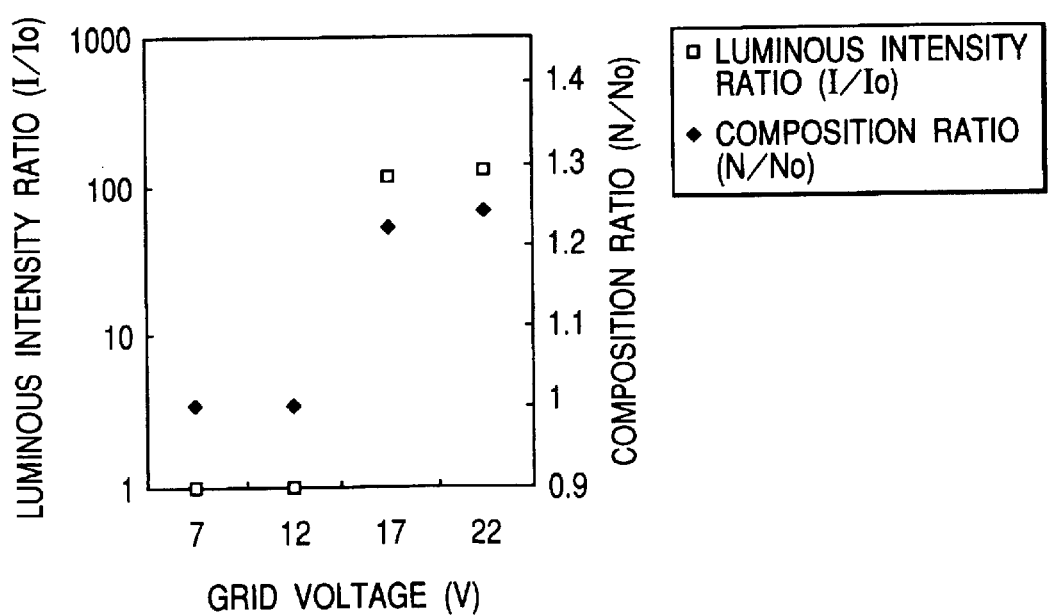
FIG. 8 is a graph, according to Example 3 of the present invention, showing the dependence of a luminous intensity ratio (I/Io) which indicates a level of generation of an excitation state by optically permitted transition, and a relative composition ratio (N/No) which indicates a level of introduction of a reactive gas into a deposited film, on a grid voltage.

FIG. 8 is a graph showing the dependence of the relative composition ratio (N/No) and the luminous intensity ratio (I/Io) on the grid voltage.

From FIG. 8, it is observable that the film had a substantially stoichiometric composition when the grid voltage was 17 V or higher.

Figure 9:
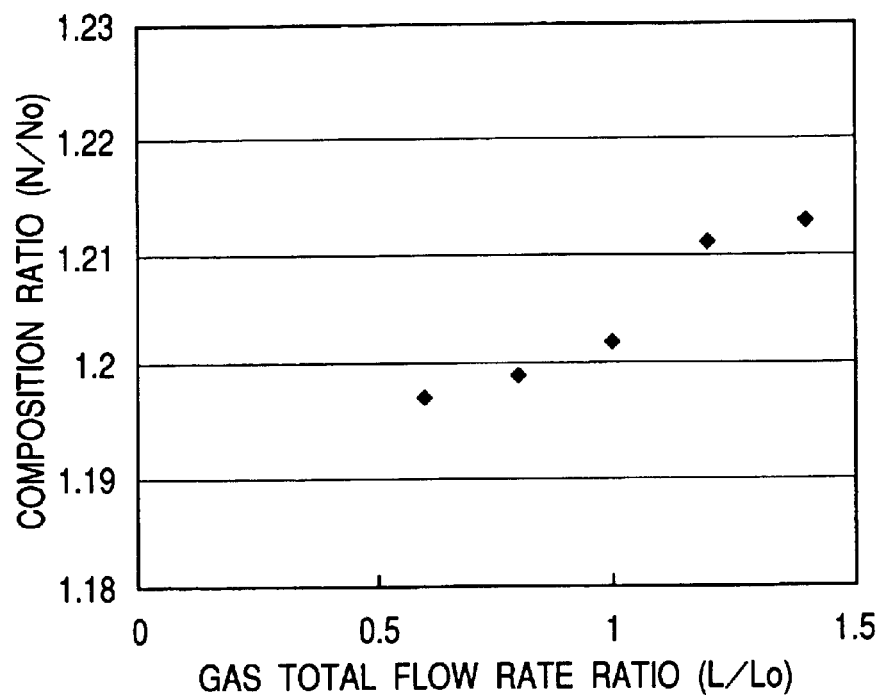
FIG. 9 is a graph, according to 3 of the present invention, showing the dependence of a relative composition ratio (N/No), which indicates a level of introduction of reactive gas into a deposited film, on a total gas flow rate ratio.
Figure 10:
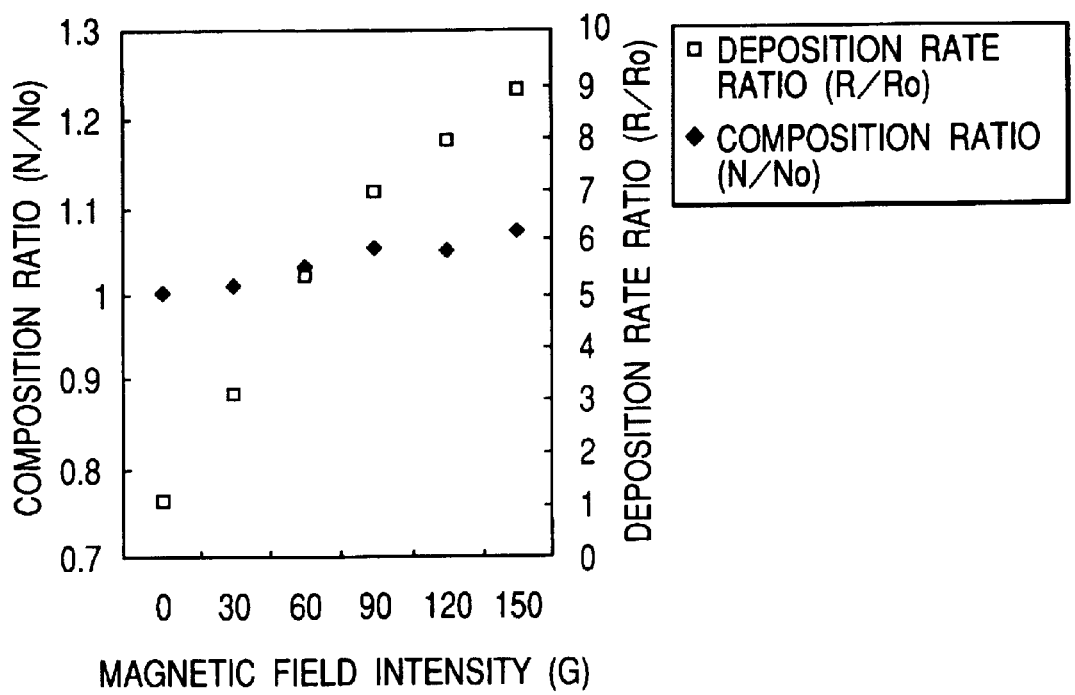
FIG. 10 is a graph, according to Example 3 of the present invention, showing the dependence of a deposition rate ratio (R/Ro), and a relative composition ratio (N/No) which indicates a level of introduction of a reactive gas into a deposited film, on a magnetic field intensity.

Also FIG. 9 is a graph showing the dependence of the relative composition ratio (N/No) on the total gas supply amount ratio (L/Lo), and FIG. 10 is a graph showing the dependence of the deposition rate ratio (R/Ro) and the relative composition ratio (N/No) on the magnetic field intensity.

From FIGS. 8, 9 and 10, it is understood that, in the method for forming a deposited film according to the present invention, since the rare gas includes at least either of atoms in the optically permitted transition excited state and atoms in the quasi-stable excited state, and a divergent magnetic field directed toward the substrate on which a film is to be formed is present in the flying space of the raw material particles, it is possible to form a film of a high quality close to the stoichiometric composition with a high film deposition rate.

EXAMPLE 4

Example 4 is different from Example 1 in employing nitrogen as the reactive gas instead of oxygen. All other conditions were the same as in Example 1.

Figure 11:
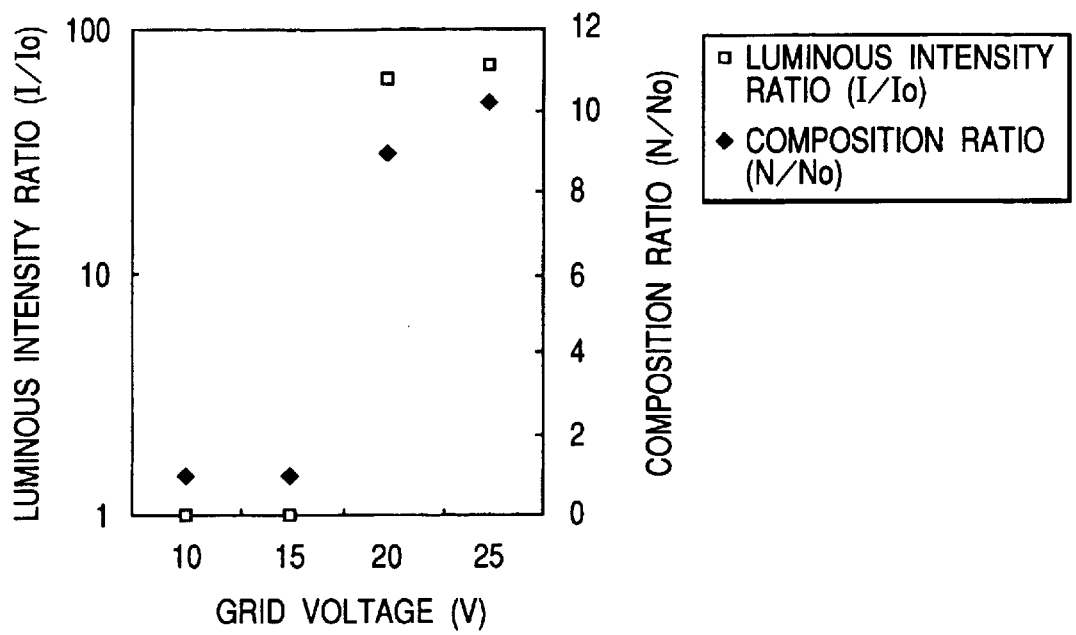
FIG. 11 is a graph, according to Example 4 of the present invention, showing the dependence of a luminous intensity ratio (I/Io) which indicates a level of generation of an excitation state by optically permitted transition, and a relative composition ratio (N/No) which indicates a level of introduction of a reactive gas into a deposited film, on a grid voltage.

FIG. 11 is a graph showing the dependence of the relative composition ration (N/No) and the luminous intensity ration (I/Io) on the grid voltage. From FIG. 11, it was confirmed that a $Si_3N_4$ film of a substantially stiochiometric composition was formed at a grid voltage of 20 V or higher.

Figure 12:
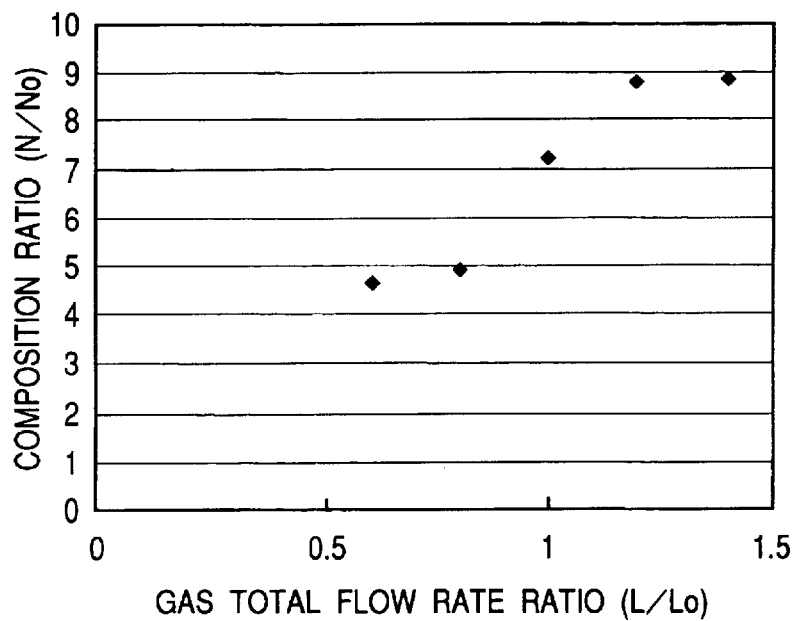
FIG. 12 is a graph, according to Example 4 of the present invention, showing the dependence of a relative composition ratio (N/No), which indicates a level of introduction of a reactive gas into a deposited film, on a total gas flow rate ratio.
Figure 13:
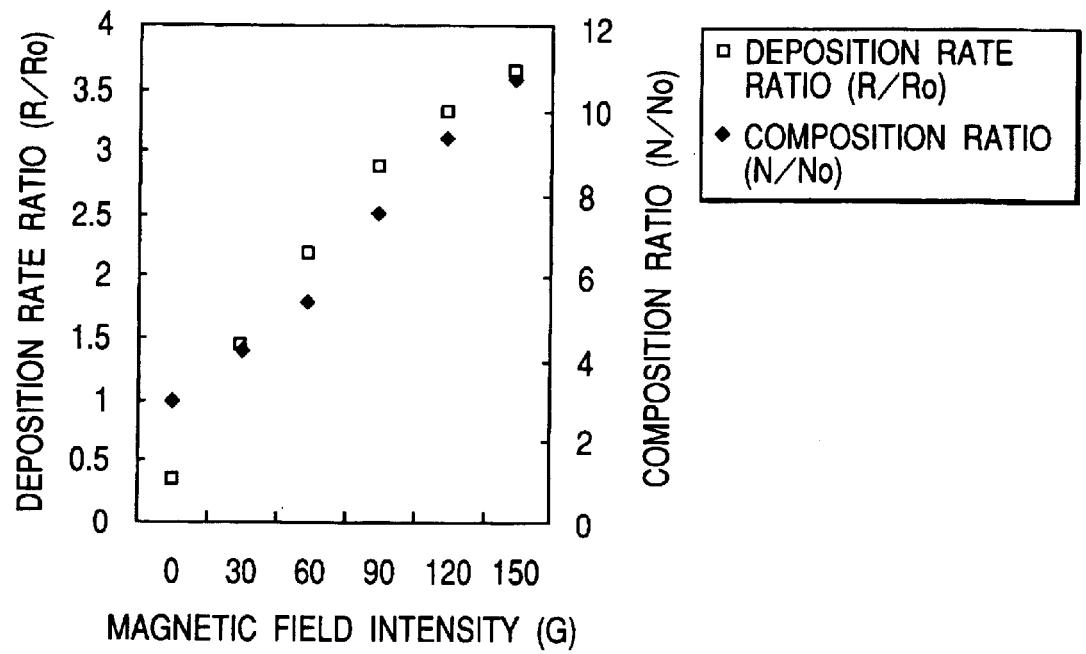
FIG. 13 is a graph, according to Example 4 of the present invention, showing the dependence of a deposition rate ratio (R/Ro), and a relative composition ratio (N/No) which indicates a level of introduction of a reactive gas into a deposited film, on a magnetic field intensity.

Also FIG. 12 is a graph showing the dependence of the relative composition ratio (N/No) on the total gas supply amount ratio (L/Lo), and FIG. 13 is a graph showing the dependence of the deposition rate ratio (R/Ro) and the relative composition ratio (N/No) on the magnetic field intensity.

From FIGS. 11, 12 and 13, it is understood that, in the method for forming a deposited film according to the present invention, since the rare gas includes at least either of atoms in the optically permitted transition excited state and atoms in the quasi-stable excited state, and a divergent magnetic field directed toward the substrate on which a film is to be formed is present in the flying space of the raw material particles, it is possible to form a film of a high quality close to the stoichiometric composition with a high film deposition rate.

EXAMPLE 5

Figure 14:
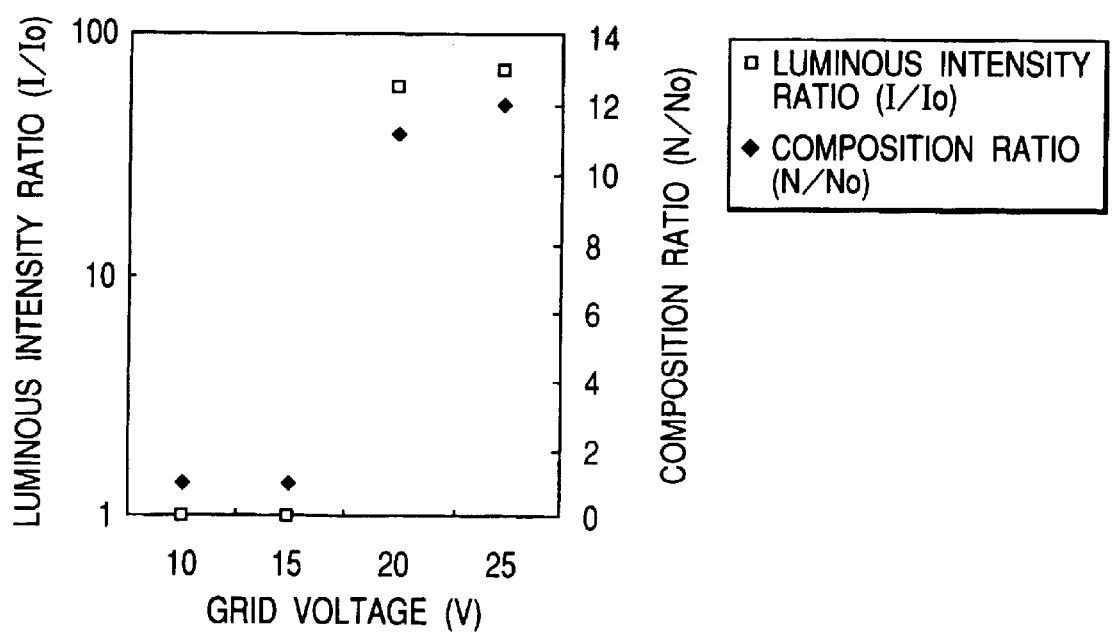
FIG. 14 is a graph, according to Example 5 of the present invention, showing the dependence of a luminous intensity ratio (I/Io) which indicates a level of generation of an excitation state by optically permitted transition, and a relative composition ratio (N/No) which indicates a level of introduction of a reactive gas into a deposited film, on a grid voltage.

Example 5 is different from Example 1 in employing fluorine as the reactive gas instead of oxygen, and employing aluminum as the sputtering target 105 instead of silicon. All other conditions were the same as in Example 1. FIG. 14 is a graph showing the dependence of the relative composition ration (N/No) and the luminous intensity ration (I/Io) on the grid voltage. From FIG. 14, it was confirmed that an $AlF_3$ film of a substantially stiochiometric composition was formed at a grid voltage of 20 V or higher.

Figure 15:
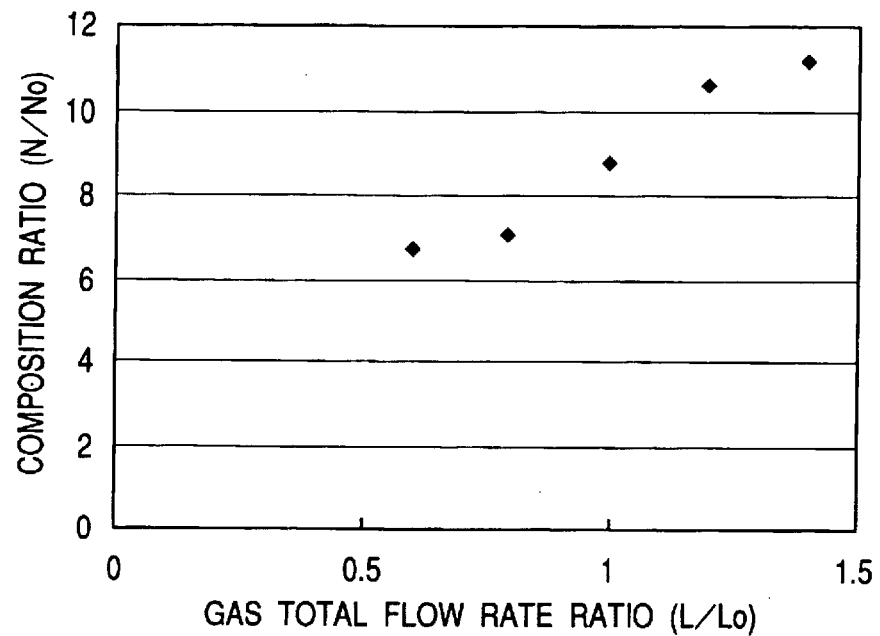
FIG. 15 is a graph, according to Example 5 of the present invention, showing the dependence of a relative composition ratio (N/No), which indicates a level of introduction of a reactive gas into a deposited film, on a total gas flow rate ratio.
Figure 16:
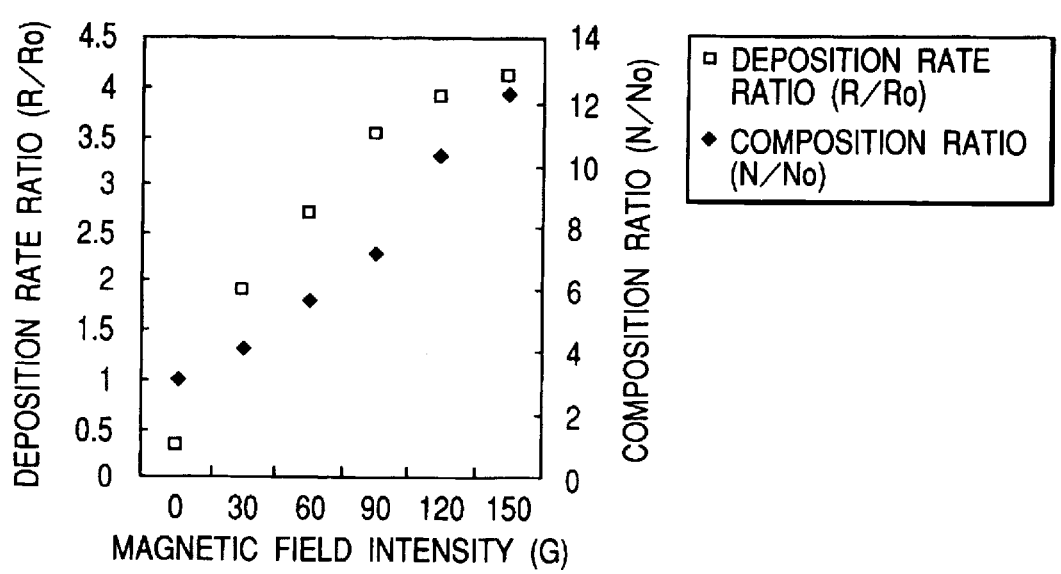
FIG. 16 is a graph, according to Example 5 of the present invention, showing the dependence of a deposition rate ratio (R/Ro), and a relative composition ratio (N/No) which indicates a level of introduction of a reactive gas into a deposited film, on a magnetic field intensity.

Also FIG. 15 is a graph showing the dependence of the relative composition ratio (N/No) on the total gas supply amount ratio (L/Lo), and FIG. 16 is a graph showing the dependence of the deposition rate ratio (R/Ro) and the relative composition ratio (N/No) on a function of the magnetic field intensity.

From FIGS. 14, 15 and 16, it is understood that, in the method for forming a deposited film according to the present invention, since the rare gas includes at least either of atoms in the optically permitted transition excited state and atoms in the quasi-stable excited state and a divergent magnetic field directed toward the substrate on which a film is to be formed is present in the flying space of the raw material particles, it is possible to form a film of a high quality close to the stoichiometric composition with a high film deposition rate.

EXAMPLE 6

Figure 17:
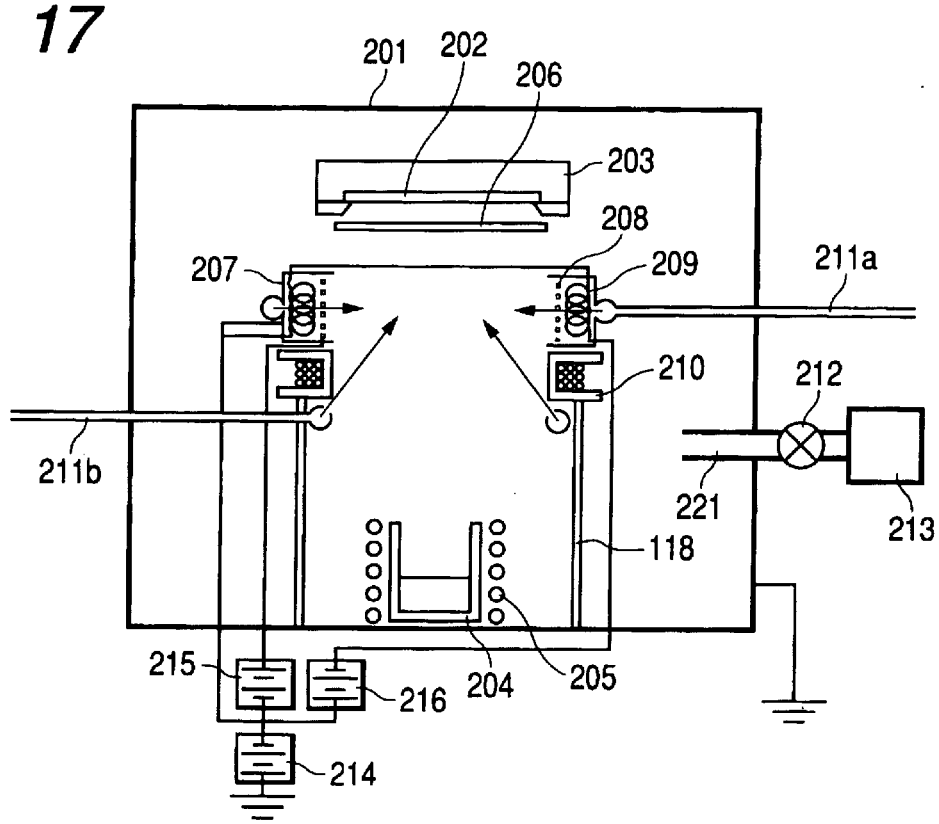
FIG. 17 is a schematic view showing another configuration of a deposited-film-forming apparatus capable of executing the method for forming a deposited film according to the present invention.

Example 6 employed a deposited-film-forming apparatus shown in FIG. 17. FIG. 17, numeral 201 denotes a vacuum chamber; 202, a substrate; 203, a substrate holder; 204, a crucible; 205, a crucible heating member; 206, a shutter; 207, an electron emitting unit; 208, a grid; 209, a filament; 210, an electromagnet; 211a, a rare gas introduction pipe; 211b, a reactive gas introduction pipe; 212, an exhaust valve; 213, vacuum-exhaust means; 214, a floating voltage setting DC power source; 215, a grid voltage setting DC power source; 216, a filament voltage setting DC power source; 218, a deposition preventing member; and 221, an exhaust pipe. This example is different from Example 1 in that the source of the raw material particles was changed from the sputtering target 105 shown in FIG. 1 to a crucible 204 (having an internal diameter and an aperture of 8 mm) of resistance heating type constituting an evaporation source, and that the raw material was changed from silicon to aluminum. As shown in FIG. 17, a crucible heating member 205 is provided around the crucible 204 for heating the crucible 204 to emit the raw material particles.

The process steps are the same as those in Example 1.

Figure 18:
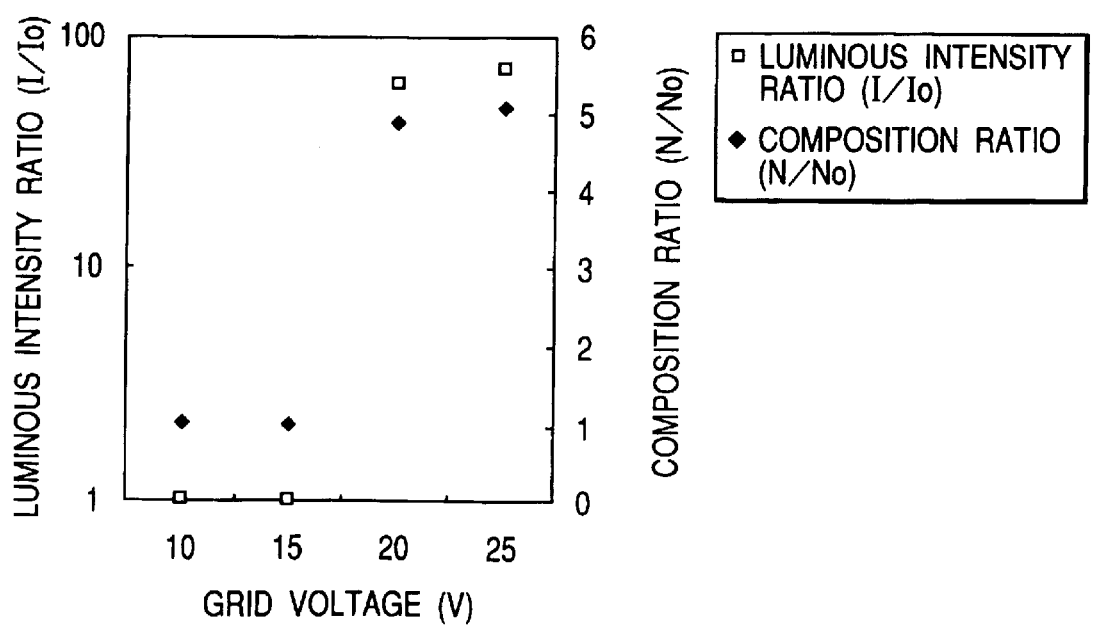
FIG. 18 is a graph, according to Example 6 of the present invention, showing the dependence of a luminous intensity ratio (I/Io) which indicates a level of generation of an excitation state by optically permitted transition, and a relative composition ratio (N/No) which indicates a level of introduction of a reactive gas into a deposited film, on a grid voltage.

FIG. 18 is a graph showing the dependence of the relative composition ration (N/No) and the luminous intensity ration (I/Io) on the grid voltage. From FIG. 18, it was confirmed that an $Al_2O_3$ film of a substantially stiochiometric composition was formed at a grid voltage of 20 V or higher.

Figure 19:
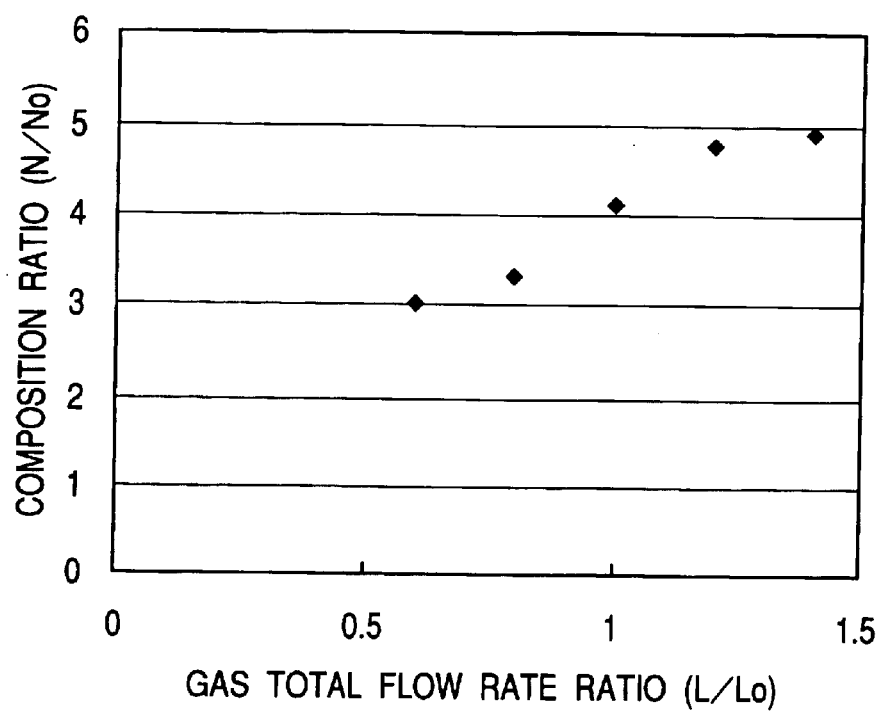
FIG. 19 is a graph, according to Example 6 of the present invention, showing the dependence of a relative composition ratio (N/No), which indicates a level of introduction of a reactive gas into a deposited film, on a total gas flow rate ratio.
Figure 20:
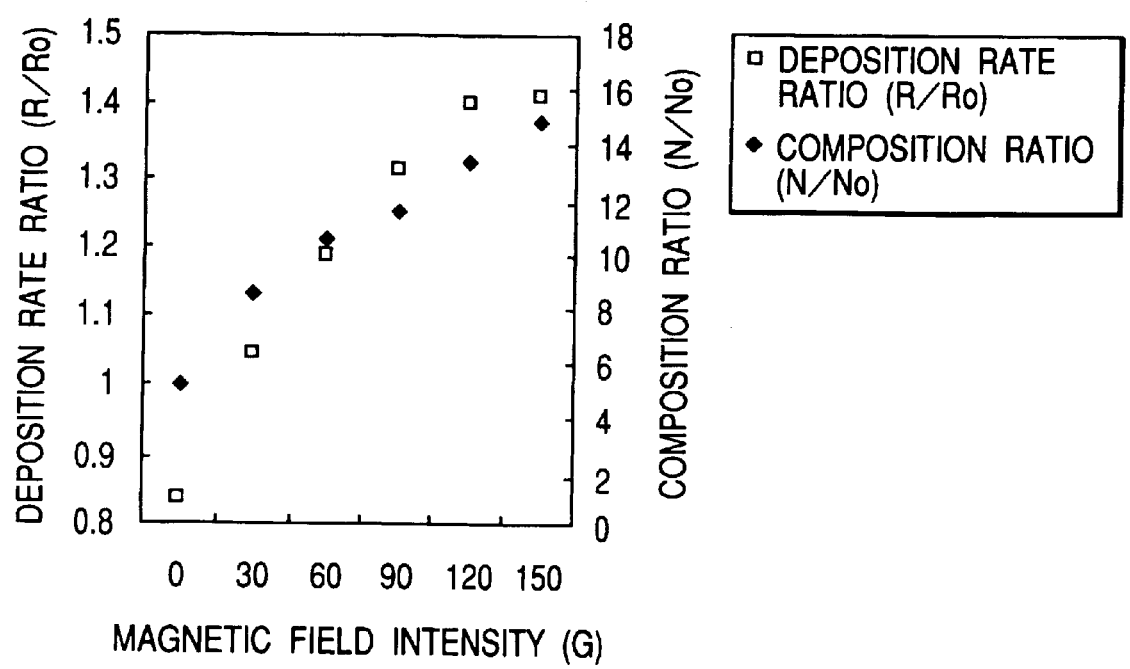
FIG. 20 is a graph, according to Example 6 of the present invention, showing the dependence of a deposition rate ratio (R/Ro), and a relative composition ratio (N/No) which indicates a level of introduction of a reactive gas into a deposited film, on a magnetic field intensity.

Also FIG. 19 is a graph showing the dependence of the relative composition ratio (N/No) on the total gas supply amount ratio (L/Lo), and FIG. 20 is a graph showing the dependence of the deposition rate ratio (R/Ro) and the relative composition ratio (N/No) on the magnetic field intensity.

From FIGS. 18, 19 and 20, it is understood that, in the method for forming a deposited film according to the present invention, since the rare gas includes at least either of atoms in the optically permitted transition excited state and atoms in the quasi-stable excited state and a divergent magnetic field directed toward the substrate on which a film is to be formed is present in the flying space of the raw material particles, it is possible to form a film having a high quality close to the stoichiometric composition at a high film deposition rate, even in case the evaporation source for the raw material was changed to a crucible.

What is claimed is:

1. A deposited-film-forming method of forming a compound film on a substrate on which a film is to be formed, comprising:

(a) emitting particles of a raw material from a raw material particle generation source, opposed to the substrate, in a direction of the substrate;

(b) supplying atoms of a reactive gas to a flying space of the articles of the raw material, the space being interposed between the substrate and the raw material particle generation source;

(c) supplying atoms of a rare gas in an excited state to the flying space of the particles of the raw material to ionize the atoms of the reactive gas and the particles of the raw material;

(d) generating a divergent magnetic field from the raw material particle generation source in a direction of the substrate; and (e) forming a compound film on the substrate by a chemical reaction of the ionized atoms of the reactive gas and the ionized particles of the raw material.

2. A method according to claim 1, wherein the excited state is a quasi-stable excited state.

3. A method according to claim 1, wherein the excited state is an excited state by optically permitted transition.

4. A method according to claim 1, wherein the excited state is a quasi-stable excited state and an excited state by optically permitted transition.

5. A method according to claim 1, wherein the rare gas atoms in the excited state have an internal energy capable of ionizing the atoms of the reactive gas.

6. A method according to claim 1, wherein the rare gas atoms in the excited state are generated by an electron flow supplied to the flying space of the particles of the raw material.

7. A method according to claim 1, wherein the rare gas atoms are helium.

8. A method according to claim 1, wherein the rare gas atoms are neon.

* * * * *

UNITED STATES PATENT AND TRADEMARK OFFICE
CERTIFICATE OF CORRECTION

PATENT NO.    : 6,787,478 B2
DATED         : September 7, 2004
INVENTOR(S)   : Atsushi Koike et al.

It is certified that error appears in the above-identified patent and that said Letters Patent is hereby corrected as shown below:

<u>Column 16,</u>
Line 65, insert:
-- 9.    A deposited film-forming apparatus of forming a compound film on a substrate on which a film is to be formed, comprising:
   a raw material particle generation source for emitting particles of a raw material, opposed to the substrate;
   a reactive gas introduction pipe for supplying atoms of a reactive gas to a flying space of the particles of the raw material, the space being interposed between the substrate and the raw material particle generation source;
   a rare gas introduction pipe for supplying a rare gas to the flying space;
   an exciting unit for promoting the rare gas to an excited state; and
   a divergent magnetic field generation means for generating a divergent magnetic field from the raw material particle generation source in a direction of the substrate. --.

Signed and Sealed this

Sixteenth Day of August, 2005

JON W. DUDAS
*Director of the United States Patent and Trademark Office*